Figure 1:
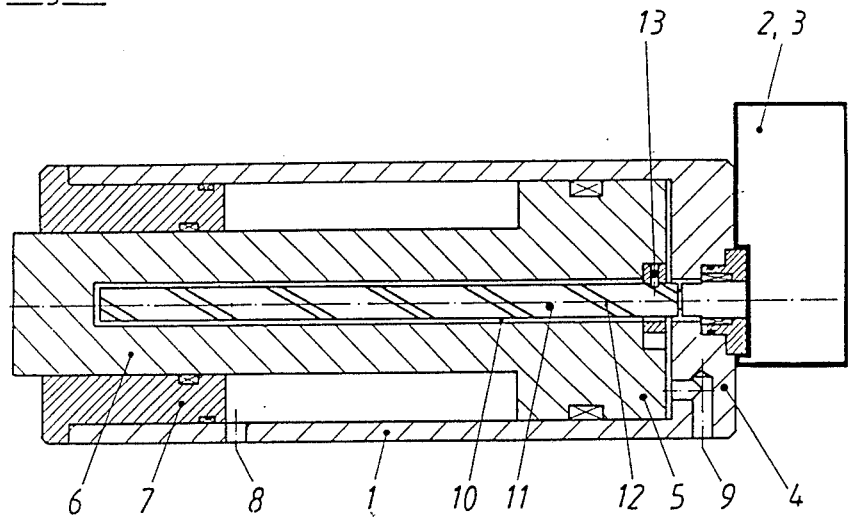

United States Patent [19]

Krieger, deceased et al.

[11] Patent Number: 4,769,538
[45] Date of Patent: Sep. 6, 1988

[54] PISTON STROKE DIGITAL DETERMINATION MEANS

[75] Inventors: Karl Krieger, deceased, late of Wuppertal, Fed. Rep. of Germany, by Hildegard Krieger, heir; Werner Reinelt, Bochum, Fed. Rep. of Germany

[73] Assignee: Hermann Hemschedit Maschinenfabrik GmbH & Co., Wuppertal, Fed. Rep. of Germany

[21] Appl. No.: 871,379

[22] Filed: Jun. 6, 1986

[30] Foreign Application Priority Data

Jun. 7, 1985 [DE] Fed. Rep. of Germany ....... 3520478
Jun. 7, 1985 [DE] Fed. Rep. of Germany ....... 3520482

[51] Int. Cl.⁴ ............................................. G01D 5/34
[52] U.S. Cl. ................................. 250/231 R; 116/202
[58] Field of Search ........ 250/231 R, 231 SE, 237 G; 33/1 PT, 125 C; 116/D 21, 202, 230, 277; 340/347 P, 686; 356/395

[56] References Cited

U.S. PATENT DOCUMENTS 2,566,332 9/1951 Huber .................................. 116/202
2,567,430 9/1951 Griffiths ............................ 116/202
4,123,653 10/1978 Bovio ............................ 250/231 SE Primary Examiner—David C. Nelms
Assistant Examiner—Stephone B. Allen
Attorney, Agent, or Firm—Berman, Aisenberg & Platt

[57] ABSTRACT

The invention concerns apparatus for the determination of the length of stroke of a piston in a working cylinder, especially in a hydraulic, walking, mine-roof support. For this purpose a piston shaft is rotatably mounted in one end portion of the working cylinder and extends into a hollow cylindrical piston rod of the piston. Through a pin on the piston or piston rod which engages in a helical guide groove on the piston shaft, the latter is rotated during movements of the piston. The piston shaft is connected to a code plate provided with a pattern of holes and displaceable on rotation of the shaft between light-emitting elements on one side and light-detecting diodes on the other side. The combination of irradiated and darkened light-detecting diodes represents a digitally-detectable binary numeral sequence which corresponds to a specific piston position.

8 Claims, 2 Drawing Sheets

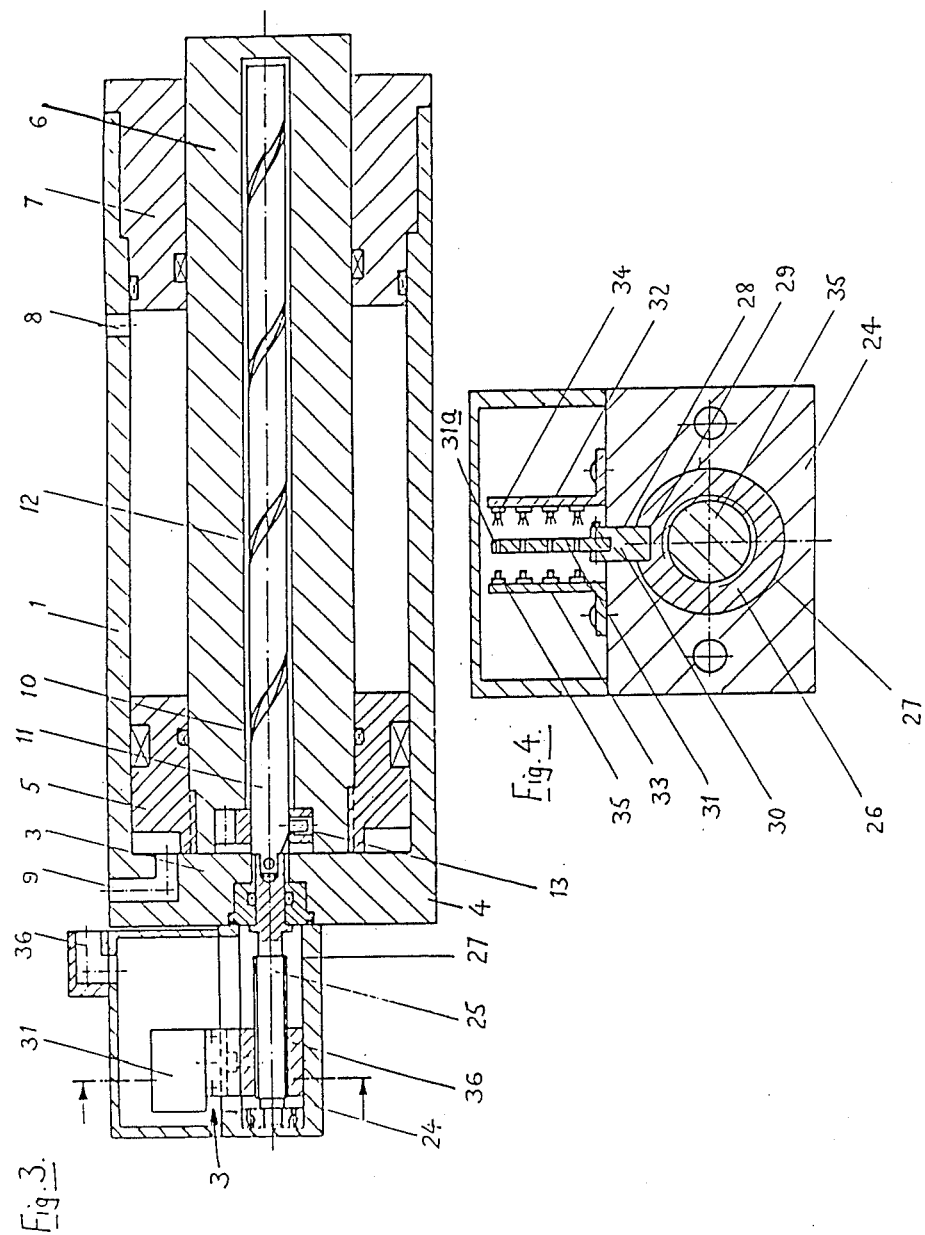

PISTON STROKE DIGITAL DETERMINATION MEANS

This invention relates to apparatus for the digital determination of the length of a piston stroke, especially the stroke of a piston in a working cylinder of an hydraulic, walking, mine-roof support.

For the determination of the lengths of the piston strokes in hydraulic working cylinders incorporated in hydraulic, walking, mine-roof supports, it has been proposed to convert the linear stroke movements of the piston and the piston rod into proportional rotational movements of a rod of helical formation and to measure those rotational movements with a rotary potentiometer ("Gluckauf" 101 (1965) p. 716). In this way direct current voltage signals are generated analogously with the stroke movements of the piston in the working cylinder. The analogue values are converted by a convertor into digital values and are detected and evaluated by a process computer. Since many walking mine-roof supports are used at a longwall mine face, all the potentiometers associated with the pistons of the working cylinders must be balanced with one another in order to obtain equal measured values for the distances travelled by the pistons in each case. This is a time-consuming operation and even then does not always give accurate results.

It is also known from DE-OS No. 3,106,156 to measure the stroke of the outwardly-moving piston of a working cylinder with the aid of a cable. The cable is secured at one end to the piston and is wound at the other end on to a cable drum secured to a housing. A timing arm on the cable drum actuates a counting mechanism and a connected electric pulse emitter during outward movement of the piston. Measurement of the piston strokes in *both* directions of movement is not therefore provided.

The aim of the present invention is to provide apparatus of simple construction for the determination of the length of the piston stroke which does not suffer from the drawbacks mentioned above and which supplies digital measured values with a high accuracy of measurement.

With this aim in view, apparatus according to the invention comprises a piston having a piston rod of hollow cylindrical shape into which projects a piston shaft rotatably mounted in an end portion of the cylinder, the piston shaft being provided on its peripheral surface with a helical guide groove in which is engaged, for sliding movement along the groove, a pin secured to the piston or piston rod so that the piston shaft carries out rotating movements proportional to the piston stroke as the piston moves in either direction in the cylinder, in which the piston shaft is connected to a code plate of a digital counting device so as to transmit movement to that plate, the plate being arranged between light-emitting elements and light-detecting elements.

Apparatus of this construction permits the movements of the piston in the working cylinder to be measured digitally, directly, in very small part steps. Thus, in one form of the invention, the code plate is mounted for rotation and has a spindle which is rotatably driven by the piston shaft, on movement of the piston, through reduction gearing. The reduction ratio of the gearing is adapted to the turns of the helical guide groove in the piston shaft in such a way that the revolutions of the piston shaft during one full piston stroke correspond to a 360 degree revolution of the code plate of the counting device. A pattern of holes in the code plate permits, with appropriate arrangement of the light-emitting elements, the display of very small angular movements. With a guide groove extending several times round the piston shaft, the length of the piston stroke is measured in very small part steps with high accuracy. Further, the apparatus requires only a few components which can be easily accommodated in a housing of small dimensions.

In another form of the invention, the piston shaft is connected to, or is integral with, a screw-threaded rod which is mounted in a housing of the digital counting device and which engages in a screw-threaded bush displaceable axially of the piston shaft, the bush being connected to the code plate. If the guide groove extends several times around the piston shaft, the screw-threads on the threaded rod and the threaded bush can be so chosen that the comparatively long movement of the piston is converted precisely into a short longitudinal movement of the code plate in the counting device. This permits, by appropriate arrangement of the light-emitting elements, the display of very small angular movements.

Figure 2:
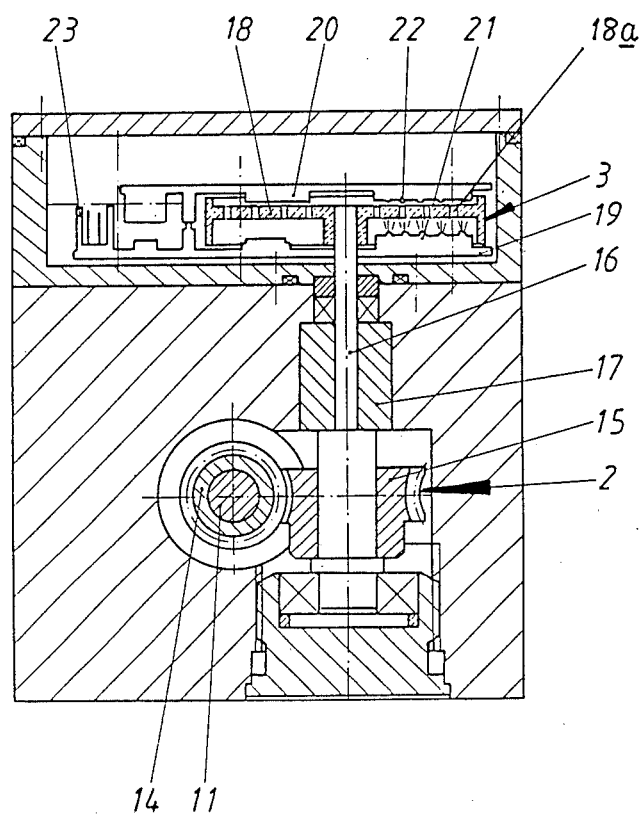

Two examples of apparatus in accordance with the invention are shown in the accompanying drawings, wherein FIG. 1 shows an hydraulic working cylinder of an hydraulic, walking, mine-roof support in longitudinal section;

FIG. 2 shows, in cross section, a device forming part of the cylinder shown in FIG. 1 for determining the length of the piston stroke; and FIGS. 3 and 4 are views corresponding to FIGS. 1 and 2 of a second form of working cylinder in accordance with the invention.

The hydraulic working cylinder 1 shown in FIGS. 1 and 2 incorporates reduction gearing 2 and a digital counting device 3 mounted on an end piston 4 of the cylinder. Within the swept volume of the cylinder 1 is a piston 5 having a piston rod 6 which is guided for longitudinal displacement. The end of the cylinder remote from the end portion 4 is closed by a cylinder head 7. The piston 5 can be charged with pressure fluid on either side through fluid connections 8 and 9.

The piston 5 and the piston 6 are of hollow cylindrical shape so as to have a longitudinal bore 10 extending along the axis of the cylinder 1. A piston shaft 11 rotatably mounted in the cylinder end portion 4 projects into the bore 10 and has, on its peripheral surface, a helical guide groove 12 extending several times around the shaft. A pin 13 secured to piston 5 slidingly engages in the guide groove 12 so as to impart a rotating movement, directed to right or left, to the piston shaft 11 in proportion to the stroke movement of the piston. As shown in FIG. 1, the reduction gearing 2 and the digital counting device 3 are arranged on the end portion 4 of the cylinder with gaskets (not further designated) being provided to seal off the cylinder 1 and the reduction gearing 2.

As shown in FIG. 2 the piston shaft 11 extends into the housing of the reduction gearing 2. The reduction gearing itself comprises a multi-start worm 14 on the shaft 11 and a worm wheel 15 for stepping down rotating movement of the piston shaft 11. The worm wheel 15 is arranged at right angles to the worm 14 and engages it in a predetermined reduction ratio.

The worm wheel 15 is mounted on a spindle 16 arranged at right angles to the piston shaft 11, which spindle is rotatably mounted in a bush 17 with one end extending into a housing 2 of the counting device 3 which is attached to the housing of the reduction gearing 2. The digital counting device 3 comprises a code plate 18 which is rotatably mounted between two circuit boards 19, 20 arranged parallel with one another and with the main part of the code plate, the code plate being fitted on to the upper end of the spindle 16. On the circuit board 19 there is a row of light-emitting diodes 21 as a light-emitting elements, and on the other circuit board 20 there is a corresponding number of light-receiving diodes 22, as light-detecting elements, which are connected to a plug 23. On rotation of the code plate 18, which is provided with a pattern of holes 18a, through a predetermined angle, a different combination of light-receiving diodes 22 will be irradiated in each case so as to represent a digitally detectable binary numeral sequence. The numeral sequence thus corresponds to a specific distance (length of stroke) which the piston of the working cylinder has travelled outwards or inwards.

The cylinder shown in FIGS. 3 and 4 is similar in many respects to that shown in FIGS. 1 and 2, and like reference numerals have been used to designate identical or similar parts. The main difference between the two constructions lies in the absence, in FIGS. 3 and 4, of the particular reduction gearing shown in FIG. 2, and of the use of a different digital counting device 3. Thus, in FIGS. 3 and 4 the piston shaft 11 passing through the cylinder end portion 4 enters a housing 24 so as to be connected to, or be integral with, a rotatably mounted screw-threaded rod 25 arranged co-axially with the shaft. This screw-threaded rod 25 engages in a corresponding internally-threaded bush 26 which is axially displaceable in a bore 27 of the housing 24 which is otherwise of solid formation in this region. Between the bore 27 and the open upper part of the housing 24 a longitudinal slot 28 (see FIG. 4) extends in the same direction as a longitudinal groove 29 in the peripheral surface of the screw-threaded bush 26. A foot or root 30 of a code plate 31, which is longitudinally displaceable in the longitudinal slot 28, is mounted in the longitudinal groove 29 of the screw-threaded bush 26. The code plate 31, which is of generally rectangular form and is provided with a pattern of holes 31a, is displaceable between two circuit boards 32, 33 located in the open upper part of the housing 24. Light-emitting elements 34 are arranged in a vertical row on the circuit 32, while light-receiving diodes 35 are arranged in a vertical row on the other circuit board 33. Electric cables (not shown) are introduced into the housing 24 through a connection 36 with a micro-computer (likewise not shown) comprising micro-processors and memory elements being connected in the circuit.

The piston 5 with the piston rod 6 is driven in and out by the supply of pressurised hydraulic fluid through the connections 8 and 9 respectively. With each longitudinal movement of the piston, the piston shaft 11 is rotated by the pin 13 engaging in the helical guide groove 12. This rotating movement is transmitted to the screw-threaded rod 25. Thus, the screw-threaded bush 26, guided with the foot 30 of the code plate 31 in the longitudinal slot 28, is displaced in the longitudinal direction. In this way the comparatively long stroke movement of the piston 5 is converted into a short longitudinal movement of the code plate 31. As the code plate 31 travels between the light-emitting elements 34 and the light-receiving diodes 35, a specific combination of light-receiving diodes is irradiated in each case by the pattern of holes 31a in the code plate 31. The combination results in each case in a binary measured value which is stored and processed in the micro-computer.

We claim:
1. Apparatus for the digital determination of the length of a piston stroke, especially the stroke of a piston in a working cylinder of an hydraulic, walking, mine-roof support, comprising:
   (a) a piston assembly including a piston and a piston rod of hollow cylindrical shape extending from one face of the piston;
   (b) a piston shaft rotatably mounted in an end portion of the cylinder and projecting into the hollow piston rod;
   (c) a helical guide groove in the peripheral surface of the piston shaft;
   (d) a pin secured to the piston assembly for sliding movement along the groove whereby the piston shaft carries out rotary movements proportional to the piston stroke as the piston moves in either direction in the cylinder;
   (e) a code plate of a digital counting device operably connected to the piston shaft whereby rotary movements of the piston shaft are transmitted to that plate; and
   (f) light-emitting elements arranged on one side of the code plate and light-detecting elements arranged on the other side of the code plate to give a digital determination of the length of the piston stroke.

2. Apparatus according to claim 1, in which the code plate is mounted for rotation and has a spindle which is rotatably driven by the piston shaft, on movement of the piston, through reduction gearing.

3. Apparatus according to claim 1, in which the code plate is provided with a pattern of holes through which light from the light-emitting elements can pass to the light-detecting elements.

4. Apparatus according to claim 1, in which the light-emitting elements and the light-detecting elements are light-emitting diodes and light-receiving diodes respectively.

5. Apparatus according to claim 1, in which the code plate is arranged between two circuit boards carrying the light-emitting elements and the light-detecting elements respectively.

6. Apparatus according to claim 1, in which the code plate is guided for movement in the direction of the cylinder axis and in the same direction as the piston rod moves.

7. Apparatus according to claim 5, in which the code plate includes a generally flat portion which lies substantially parallel to the two circuit boards arranged one on each side of it.

8. Apparatus according to claim 6, in which the piston shaft is integral with a screw-threaded rod which is mounted in a housing of the digital counting device and which engages in a screw-threaded bush displaceable axially of the piston shaft, the bush being connected to the code plate.

* * * * *